(12) United States Patent
Lee et al.

(10) Patent No.: US 7,973,388 B2
(45) Date of Patent: Jul. 5, 2011

(54) SEMICONDUCTOR STRUCTURES INCLUDING SQUARE CUTS IN SINGLE CRYSTAL SILICON

(75) Inventors: Whonchee Lee, Boise, ID (US); Janos Fucsko, Boise, ID (US); David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/565,557

(22) Filed: Sep. 23, 2009

(65) Prior Publication Data
US 2010/0013061 A1    Jan. 21, 2010

Related U.S. Application Data

(62) Division of application No. 11/445,718, filed on Jun. 2, 2006, now Pat. No. 7,628,932.

(51) Int. Cl.
*H01L 29/06* (2006.01)
(52) U.S. Cl. ........ 257/623; 257/618; 257/628; 257/627; 257/626; 257/E21.038; 438/700; 438/243; 438/386
(58) Field of Classification Search ................. 257/618, 257/623, 626–628, E21.038, E21.235; 438/700, 438/243, 386
See application file for complete search history.

(56) References Cited

U.S. PATENT DOCUMENTS

| | | | |
|---|---|---|---|
| 4,407,058 A * | 10/1983 | Fatula et al. ................. 438/242 |
| 4,531,282 A | 7/1985 | Sakai et al. | |
| 4,891,255 A | 1/1990 | Ciarlo | |
| 5,427,975 A | 6/1995 | Sparks et al. | |
| 5,536,675 A | 7/1996 | Bohr | |
| 6,100,162 A | 8/2000 | Doan et al. | |
| 6,245,615 B1 | 6/2001 | Noble et al. | |
| 6,290,863 B1 | 9/2001 | Morgan et al. | |
| 6,319,333 B1 | 11/2001 | Noble | |
| 6,339,241 B1 | 1/2002 | Mandelman et al. | |
| 6,358,861 B1 | 3/2002 | Ohji et al. | |
| 6,391,793 B2 | 5/2002 | Lee et al. | |
| 6,465,865 B1 | 10/2002 | Gonzalez | |
| 6,518,112 B2 | 2/2003 | Armacost et al. | |
| 6,566,273 B2 | 5/2003 | Kudelka | |
| 6,602,745 B2 | 8/2003 | Thwaite et al. | |
| 6,660,180 B2 * | 12/2003 | Lee et al. ..................... 252/79.1 |
| 6,686,214 B2 | 2/2004 | Antaki et al. | |
| 6,713,341 B2 | 3/2004 | Chen et al. | |
| 6,784,076 B2 | 8/2004 | Gonzalez et al. | |
| 6,808,994 B1 | 10/2004 | Wang | |
| 6,825,127 B2 | 11/2004 | Ouellet et al. | |

(Continued)

OTHER PUBLICATIONS

Bassous, Ernest, "Fabrication of Novel Three-Dimensional Microstructures by the Anisoptropic Etching of (100) and (110) Silicon," IEEE Transactions on Electron Devices, Oct. 1978, pp. 1178-1185, vol. 25, No. 10.

(Continued)

*Primary Examiner* — Zandra Smith
*Assistant Examiner* — Telly D Green
(74) *Attorney, Agent, or Firm* — TraskBritt

(57) ABSTRACT

A single crystal silicon etching method includes providing a single crystal silicon substrate having at least one trench therein. The substrate is exposed to a buffered fluoride etch solution which undercuts the silicon to provide lateral shelves when patterned in the <100> direction. The resulting structure includes an undercut feature when patterned in the <100> direction.

14 Claims, 6 Drawing Sheets

U.S. PATENT DOCUMENTS

| | | | |
|---|---|---|---|
| 6,858,903 | B2 | 2/2005 | Natzle et al. |
| 6,881,622 | B2 | 4/2005 | Yu et al. |
| 6,902,962 | B2 | 6/2005 | Yeo et al. |
| 6,909,147 | B2 | 6/2005 | Aller et al. |
| 6,927,104 | B2 | 8/2005 | Lee et al. |
| 6,960,507 | B2 | 11/2005 | Kim et al. |
| 6,960,821 | B2 | 11/2005 | Noble et al. |
| 6,963,114 | B2 | 11/2005 | Lin |
| 6,964,903 | B2 | 11/2005 | Forbes et al. |
| 6,968,110 | B2 | 11/2005 | Patel et al. |
| 6,977,227 | B2 | 12/2005 | Lin et al. |
| 7,045,073 | B2 | 5/2006 | Hareland et al. |
| 7,045,407 | B2 | 5/2006 | Keating et al. |
| 7,045,468 | B2 | 5/2006 | Liang |
| 7,166,539 | B2 | 1/2007 | Fucsko et al. |
| 2002/0025636 | A1 | 2/2002 | Ju |
| 2002/0132423 | A1* | 9/2002 | Tsao ............................... 438/243 |
| 2003/0003759 | A1* | 1/2003 | Kudelka ......................... 438/733 |
| 2003/0057438 | A1 | 3/2003 | Yu et al. |
| 2004/0014280 | A1 | 1/2004 | Willer et al. |
| 2004/0036121 | A1* | 2/2004 | Aoki et al. ..................... 257/365 |
| 2004/0067346 | A1 | 4/2004 | Hofmann et al. |
| 2004/0214436 | A1 | 10/2004 | Dow |
| 2005/0208727 | A1* | 9/2005 | Lin et al. ........................ 438/386 |
| 2007/0173007 | A1 | 7/2007 | Lee et al. |
| 2007/0281488 | A1 | 12/2007 | Wells et al. |
| 2007/0281493 | A1 | 12/2007 | Fucsko et al. |

OTHER PUBLICATIONS

Bean, Kenneth E., "Anisotropic Etching of Silicon," IEEE Transactions on Electron Devices, Oct. 1978, pp. 1185-1193, vol. 25, No. 10.

Chu et al., A Novel Convex Corner Compensation for Wet Anisotropic Etching on (100) Silicon Wafer, Date Unknown, pp. 253-256.

Fried et al., Improved Independent Gate N-Type FinFET Fabrication and Characterization, IEEE Electron Device Letters, Sep. 2003, pp. 592-594, vol. 24, No. 9.

Huang et al., ASub-50nm P-Channel FinFET, IEEE Transactions on Electron Devices, May 2001, pp. 880-886, vol. 48, No. 5.

Jackson et al., "An Electrochemical P-N Junction Etch-Stop for the Formation of Silicon Microstructures," IEEE Electron Device Letters, Feb. 1981, vol. EDL-2, No. 2.

Kim et al., "Advance Integration Technology for a Highly Scalable SOI DRAM with SOC (Silicon-On-Capacitors)," IEDM, 1996, pp. 605-608, vol. 96.

Lee et al., Novel Body Tied FinFET Cell Array Transistor DRAM with Negative Word Line Operation for sub 60nm Technology and Beyond,@ 2004 Symposium on VLSI Technology Digest of Technical Papers, pp. 130-132.

Lee et al., "Novel Pattern Transfer Process for Bonded SOI Giga-bit DRAMS," Proceedings 1996 IEEE International SOI Conference, Oct. 1996, pp. 114-115.

Lee et al., The Surface/Bulk Micromachining (SBM) Process: A New Method for Fabricating Released MEMS in Single Crystal Silicon,@ Dec. 1999, vol. 8, No. 4.

Pandhumsoporn et al., "High Etch Rate, Deep Anisotropic Etching of Silicon for MEMS Fabrication," Proceedings of SPIE, vol. 3328, p. 93-101, 1998.

Wagner, Andrew, AKOH Si Wet Etch Review, Date Unknown, pp. 1-14.

Yeo, et al., "80 nm 512M DRAM with Enhanced Data Retention Time Using Partially-Insulated Cell Array Transistor (PiCAT)," 2004 Symposium on VLSI Technology Digest of Technical Papers, pp. 30-31.

Yeo, et a. "Transistor Test Structures for Leakage Current Analysis of Partial SOI", IEEE International Conference on Microelectronic Test Structures, pp. 245-247, Mar. 2004.

International Search Report dated Nov. 26, 2007, for International Application No. PCT/US2007/012904 ( 3 pages).

Sato et al., Development of an Orientation-Dependent Anisotropic Etching Simulation System MICROCAD, Electronics and Communications in Japan, Part 2, vol. 83, No. 4, 2000, pp. 13-22.

Chen, Applied Physics 298r; Apr. 12, 2004, on mask orientation, 18 pages.

\* cited by examiner

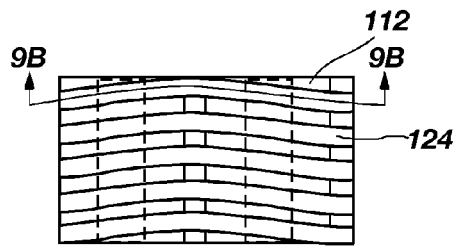
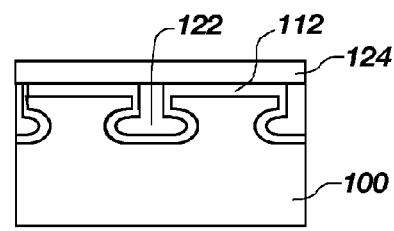
FIG. 9A        FIG. 9B
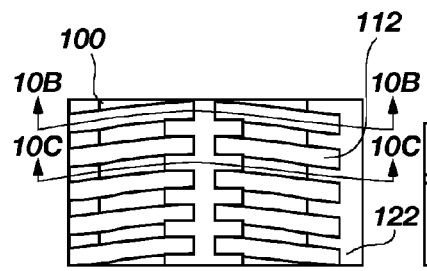
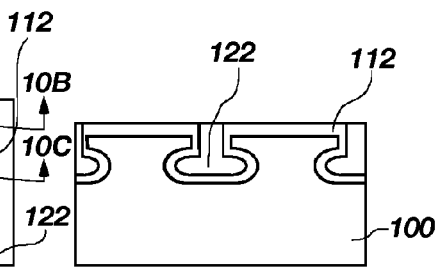
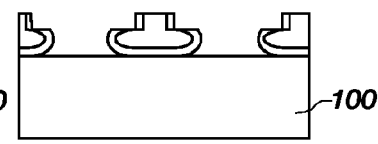
FIG. 10A     FIG. 10B     FIG. 10C
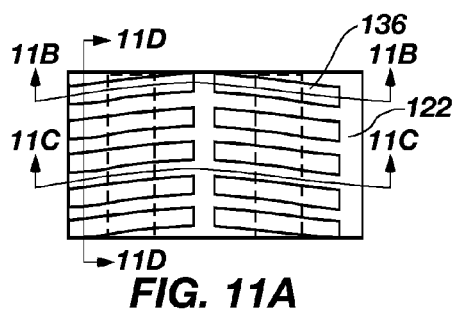
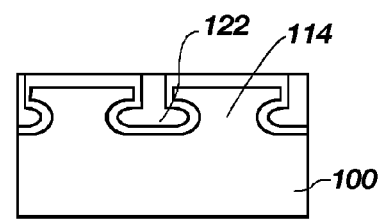
FIG. 11A        FIG. 11B
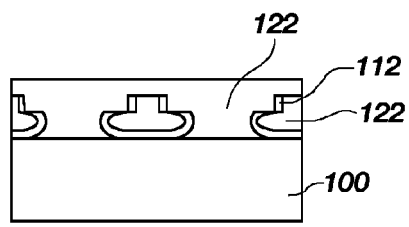
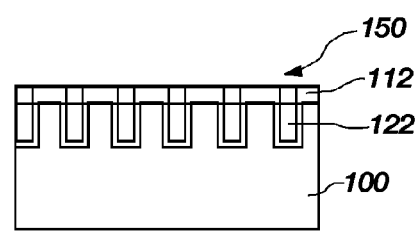
FIG. 11C        FIG. 11D

SEMICONDUCTOR STRUCTURES INCLUDING SQUARE CUTS IN SINGLE CRYSTAL SILICON

CROSS-REFERENCE TO RELATED APPLICATIONS

This application is a divisional of U.S. patent application Ser. No. 11/445,718, filed Jun. 2, 2006 now U.S. Pat. No. 7,628,932, issued Dec. 8, 2009, which is related to U.S. patent application Ser. No. 11/445,911, filed Jun. 2, 2006, now U.S. Pat. No. 7,625,776, issued Dec. 1, 2009, and U.S. patent application Ser. No. 11/445,544, filed Jun. 2, 2006 now U.S. Pat. No. 7,709,341, issued May 4, 2010, each filed on even date therewith and assigned to the Assignee of the present application, the disclosure of each of which applications is incorporated by reference herein in its entirety. The subject matter of this application is also related to U.S. patent application Ser. No. 12/622,939, filed Nov. 20, 2009, pending and U.S. patent application Serial No. 12/687,619, filed Jan. 14, 2010, pending.

BACKGROUND OF THE INVENTION

1. Field of the Invention

The present invention relates generally to methods for undercutting single crystal silicon using wet etchants. More particularly, the present invention relates to methods for creating square undercuts in single crystal silicon and resulting structures.

2. State of the Art

Higher performance, lower cost, increased miniaturization of semiconductor components, and greater packaging density of integrated circuits are ongoing goals of the computer industry. One way to reduce the overall cost of a semiconductor component is to reduce the manufacturing cost of that component. Lower manufacturing costs can be achieved through faster production as well as in reduction in the amount of materials used in fabricating the semiconductor component. In recent years, the semiconductor industry has greatly expanded its emphasis in development and production of electro-optical components, such as, for example, charge-coupled devices (CCDs) and, more recently, CMOS imagers. As with other semiconductor components, there is a continued drive toward higher performance parameters and greater yields at ever-lower costs.

Micro-electromechanical systems ("MEMS") is another technology receiving a great deal of attention in many industries, including the electronics industry. MEMS integrate microminiature electrical and mechanical components on the same substrate, for example, a silicon substrate, using microfabrication technologies to form extremely small apparatuses. The electrical components may be fabricated using integrated circuit fabrication ("IC") processes, while the mechanical components may be fabricated using micromachining processes that are compatible with the integrated circuit fabrication processes. This combination of approaches makes it possible, in many instances, to fabricate an entire microminiature system on a chip using conventional manufacturing processes. However, there remain many shortcomings in existing fabrication technologies that limit the types and sizes of MEMS components and assemblies, which may be fabricated.

Conventional IC processing for DRAM, microprocessors, etc., are currently performed on (100) silicon. Potassium hydroxide and TMAH may be used to create vertical etches in (110) silicon by using (110) substrate wafers or causing the recrystallization of the surface of a substrate wafer to have a (110) crystal orientation. However, the resultant structures are not always desirable and may introduce costly, additional processing steps and procedures to the fabrication process and create a low performance device.

Various conventional chemistries have been used to etch silicon. For example, both single crystal and polycrystalline silicon are typically wet etched in mixtures of nitric acid ($HNO_3$) and hydrofluoric acid (HF). With use of such etchants, the etching is generally isotropic. The reaction is initiated by the $HNO_3$, which forms a layer of silicon dioxide on the silicon, and the HF dissolves the silicon oxide away. In some cases, water is used to dilute the etchant, with acetic acid ($CH_3COOH$) being a preferred buffering agent.

In some applications, it is useful to etch silicon more rapidly along one or more crystal planes relative to others. For example, in the diamond lattice of silicon, generally the (111) plane is more densely packed than the (100) plane, and thus the etch rates of (111) orientated surfaces are expected to be lower than those with (100) orientations. Bonding orientation of the different planes also contributes to etchant selectivity to exposed planes. One etchant that exhibits such orientation-dependent etching properties consists of a mixture of KOH and isopropyl alcohol. For example, such a mixture may etch about one hundred (100) times faster along (100) planes than along (111) planes.

Hydroxide etchants and TMAH may be used to create a vertical undercut in (100) silicon. FIGS. 1A-2B show a silicon etch performed with different etchant solutions in both the standard silicon orientation (FIG. 1A and FIG. 2A) and 45° rotation (FIG. 1B and FIG. 2B). In the standard orientation, a mask is aligned along the <110> directions. The {111} planes define the sidewalls which are sloped from (100) surface plane. With the 45° rotation, the mask is aligned along the <100> direction. In FIG. 1, the etchant was dilute $NH_4OH$ applied at 26° C. and in FIGS. 2A and 2B, the etchant was dilute TMAH applied at 26° C. While the two etchants display different selectivity, both undercut the silicon 10 and create beveled edges or chamfers 12. The beveled edges may be undesirable for some applications and may limit the spacing of components on the integrated circuit.

Accordingly, it would be desirable to create square undercuts in (100) silicon without beveled edges, or chamfers and/or to manipulate the shape of the undercut. Further, it would be desirable to create a lateral shelf in (100) silicon using wet etch chemistry.

BRIEF DESCRIPTION OF THE SEVERAL VIEWS OF THE DRAWINGS

In the drawings, which illustrate what is currently considered to be the best mode for carrying out the invention:

FIGS. 4A-11D show a single crystal silicon wafer at various stages in a fabrication process according to one embodiment of the present invention. FIG. 4A is a plan view of single crystal silicon wafer according to an embodiment of the present invention.

FIG. 9A is a plan view of single crystal silicon wafer according to an embodiment of the present invention. FIG. 9B is a cross-sectional view of the same single crystal silicon wafer taken along line -9B- of FIG. 9A.

FIG. 10A is a plan view of single crystal silicon wafer according to an embodiment of the present invention. FIG. 10B is a cross-sectional view of the same single crystal silicon wafer taken along line -10B- of FIG. 10A. FIG. 10C is a cross-sectional view of the single crystal silicon wafer of FIG. 10A taken along line -10C- of FIG. 10A.

FIG. 11A is a plan view of single crystal silicon wafer according to an embodiment of the present invention. FIG. 11B is a cross-sectional view of the same single crystal silicon wafer taken along line -11B- of FIG. 11A. FIG. 11C is a cross-sectional view of the single crystal silicon wafer of FIG. 11A taken along line -11C- of FIG. 11A. FIG. 11D is a cross-sectional view of the single crystal silicon wafer of FIG. 11A taken along line -11D- of FIG. 11A.

DETAILED DESCRIPTION OF THE INVENTION

Figure 1A:
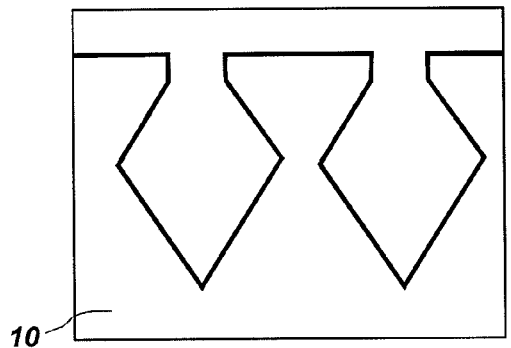
FIG. 1A is a cross-sectional view of single crystal silicon masked along the <110> direction and undercut with $NH_4OH$ applied at 26° C.
Figure 1B:
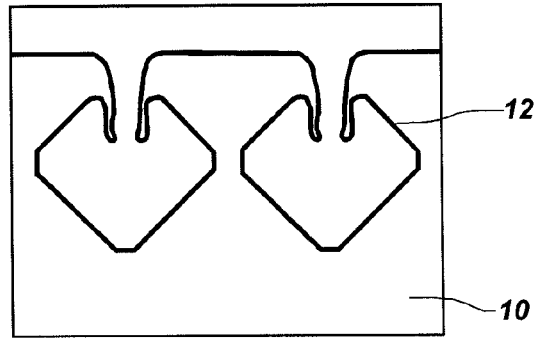
FIG. 1B shows of single crystal silicon masked along the <100> direction and undercut with $NH_4OH$ applied at 26° C.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms "wafer" and "substrate" as used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to those of ordinary skill in the art. The term "conductor" is understood to include semiconductors, and the term "insulator" is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over" and "under" are defined with respect to the conventional plane or surface being on the top surface of the wafer or substrate, regardless of the orientation of the wafer or substrate.

There is a need in the industry, as recognized by the inventors herein, to undercut (100) silicon using wet etch chemistry. A buffered fluoride etch solution may be used to create square corners and lateral shelves in (100) silicon without the typical bevel experienced with hydroxide etches when the initial pattern is oriented along the <100> direction. The wet etch chemistry of the present invention may be used to fabricate devices that have previously been prohibitively expensive, complicated and/or poor yielding.

An embodiment of the present invention further includes methods employing etchant solutions to manipulate the cavity shape of a trench underlying single crystal silicon. Etch chemistry is highly selective to crystal orientation, when using (100) crystal plane orientation and patterning in a <100> direction, a cavity shape lacking beveled corners and including a lateral shelf may be achieved.

An embodiment of the present invention includes a method of etching the (100) crystal silicon plane 2-3 times slower than the (110) and (111) silicon planes. The etch rate of (100) silicon may be approximately 5-10,000 Å/min and preferably 10-500 Å/min in dilute etchants at low temperatures. The method may include exposing the silicon to a buffered fluoride etch solution of the present invention. The method may further include a simultaneous slower etch on an oxide and/or nitride relative to the (100) silicon.

In an embodiment of the present invention, a square undercut in single crystal silicon may be created by providing single crystal silicon including at least one trench therein, patterning the single crystal silicon in the <100> direction and exposing the single crystal silicon to a solution including a fluoride component, an oxidizing agent and an inorganic acid.

In an embodiment of the present invention, a lateral shelf may be created by exposing single crystal silicon to an anisotropic etchant followed by a buffered fluoride etch solution. Alternatively, a lateral shelf may be created by exposing single crystal silicon to a first isotropic etchant to create a trench. An anisotropic etchant may be applied to undercut the silicon and a buffered fluoride etch solution may be applied to square the corners of the undercut cavity. It will be understood that the buffered fluoride etch solution, which etches silicon at different rates in different exposed planes, may be used in the trench without a first anisotropic etchant.

An embodiment of the present invention includes a semiconductor device including single crystal silicon having a square undercut feature. The undercut feature includes smooth surfaces. An embodiment of the present invention includes a semiconductor device including single crystal silicon having a lateral shelf.

Etch compositions for oxidizing silicon and etching silicon dioxide to create desired structures according to the present invention shall be generally described below. With the description as provided below, it will be readily apparent to one skilled in the art that the buffered fluoride etch compositions described herein may be used in various applications. In other words, the buffered fluoride etch compositions may be used whenever silicon etch is being performed and wherein square undercuts or lateral shelves are desired. For example, the present invention may be used in the formation of isolation structures for use in the fabrication of integrated circuits. Further, for example, the present invention may be beneficial in the fabrication of transistor structures, such as pseudo-silicon-on-insulator devices (including DRAM, SRAM, Flash, imagers, PCRAM, MRAM, CAM, etc.), FinFets, surround gate transistors, as well as micro electronic mechanical systems ("MEMS") and electro-optical components.

In one embodiment, a buffered fluoride etch composition for use in undercutting single crystal silicon to form lateral shelves generally includes a fluoride component, an inorganic acid and an oxidizing agent. The fluoride component may be, without limitation, HF, $HF_2^-$, $NH_4F$, or tetramethylammonium fluoride (TMAF). The ammonium fluoride may be formed with a mixture of ammonium hydroxide and HF. The fluoride component or solution is such that when the reaction of the etch composition with silicon forms silicon dioxide, the fluoride component or solution dissolves away the silicon dioxide formed thereby. The fluoride component may be present in the amount of 0.5-50% by weight.

The oxidizing agent of the buffered fluoride etch composition may be any oxidizing agent such as, for example, hydrogen peroxide or ozone. One currently preferred oxidizing agent is hydrogen peroxide.

The inorganic acid component may include at least one acid selected from hydrofluoric acid (HF), phosphoric acid ($H_3PO_4$), sulfuric acid ($H_2SO_4$), nitric acid ($HNO_3$), hydrochloric acid (HCl), carbonic acid ($H_2CO_3$), or any other suitable inorganic acid. It is currently preferred that the inorganic acid be $H_3PO_4$ or $H_2CO_3$. Inorganic acids are commercially available as concentrated solutions (X) which then typically are diluted to a desired concentration ($H_2O$:X). For example, commercially available concentrated acids are available as follows: HCl is 37% by weight in deionized water; $HNO_3$ is 70% by weight in deionized water; $H_2SO_4$ is 96% by weight in deionized water, and $H_3PO_4$ is 85% by weight in deionized water. Concentrations of etch compositions described herein are given based on commercially available solutions. For example, if the etch composition has a concentration of 30% HCl, then the solution includes 30% by weight of the commercially available HCl solution. Hydrogen peroxide ($H_2O_2$) is also commercially available as a concentrated solution of approximately 29% by weight in deionized water. Further, ammonium fluoride is also commercially available as a concentrated solution, approximately 40% by weight in deionized water. Further, one will recognize that multiple components of the solution may be provided from commercially available solutions. For example, a wet etch solution may be employed that provides both $NH_4F$ (~39.4 w %) and an inorganic acid (i.e., $H_3PO_4$ ~0.6 w %) that may be used to adjust the pH of the solution.

Other exemplary suitable etchants are disclosed in U.S. patent application Ser. No. 09/625,166 and U.S. Pat. No. 6,391,793 the contents of each of which document is incorporated herein by reference. The buffered fluoride etch solution preferably has a pH in the range of about 5.0 to about 9.0. More preferably, the buffered fluoride etch composition has a pH of about 7.8. Preferably, the buffered fluoride etch composition includes a fluoride component in a range of about 0.5 percent to about 50 percent by weight of the buffered fluoride etch composition, an oxidizing agent in the range of about 0.5 percent to about 30 percent by weight of the buffered fluoride etch composition; and an inorganic acid in the range of about 0.1-2% by weight. For example, the buffered fluoride etch composition may preferably include a volumetric ratio of $NH_4F$:QEII:$H_2O_2$ of about 4:2:3.

Further, preferably, the ionic strength of the buffered fluoride etch composition is greater than one; more preferably, the ionic strength is in the range of about five to about 20. As used herein, ionic strength refers to a measure of the average electrostatic interaction among ions in the composition, which is equal to one-half the sum of the terms obtained by multiplying the molality of each ion by its valence squared. Yet further, preferably, the redox potential of the etch composition is in the range of about −0.5 to about +0.7 or higher (vs. Standard Hydrogen Electrode (SHE)). As used herein, the redox potential is a measure of the effectiveness of the etch composition as an oxidizing agent, i.e., the ability of the etch composition to oxidize silicon for removal by the HF component of the etch composition.

The above ranges for the buffered fluoride etch solution are particularly applicable to the use of ammonium fluoride and hydrogen peroxide but appear to be equally applicable to buffered fluoride etch compositions having other combinations of components as described above, such as when ammonium fluoride is provided by ammonium hydroxide and hydrofluoric acid. In other words, suitable amounts of ammonium hydroxide and hydrofluoric acid may be mixed to provide an adequate amount of ammonium fluoride. When ozone is used as the oxidizing agent, ozone is preferably present in a range of about 1 part per million (ppm) to about 50 ppm.

The buffered fluoride etch solution may exhibit an etch rate of silicon that is greater than three times the etch rate of an oxide being exposed to the same etch composition, i.e., the selectivity between silicon and oxide is greater than 3. More preferably, the selectivity between silicon and oxide using the etch composition is greater than 6 compared to <100> silicon etch rate.

Further, to achieve desired throughput of wafers, the etch rate for silicon using the etch composition is preferably greater than about 5 Å/min. More preferably, the etch rate for silicon is greater than 18 Å/min. Even more preferably, the etch rate for silicon is greater than 30-50 Å per minute.

Preferably, the etch composition is such that after removal of silicon using the etch composition the silicon surface has a desired surface roughness adequate for later processing. Preferably, the roughness of the silicon surface following the etch is within the range of about 1.25 Å RMS to about 1.30 Å RMS. The silicon surface may desirably fall within such a range for roughness after more than 180 Å of silicon is removed. Generally, for example, roughness may be determined by Atomic Force Microscopy (AFM) which scans a surface area of about 1 μm² and gives an average peak-to-valley measurement across this 1 μm² surface area, rms.

Preferably, the high selectivity to oxide as described above is a high selectivity to thermal oxide. For example, such thermal oxide may be formed by thermal oxidation such as with use of a wet or dry furnace oxidation. However, such selectivity is also applicable to oxides formed by chemical vapor deposition (CVD), such as high-density plasma oxide typically used in isolation processes, such as shallow trench isolation.

Generally, any known method may be used to expose the silicon to the buffered fluoride etch solution. For example, the silicon may be immersed into a tank of the buffered fluoride etch solution. The solution may also be sprayed onto the wafers being etched or may be introduced for contact with the wafer in any other manner, e.g., drip, spraying, vapor, etc. The etching process may be performed at a temperature in the range of about 10° C. to about 90° C. Preferably, the etching process occurs at a temperature between 21° C. to about 30° C. and, more preferably, between about 22° C. and 25° C.

Figure 2A:
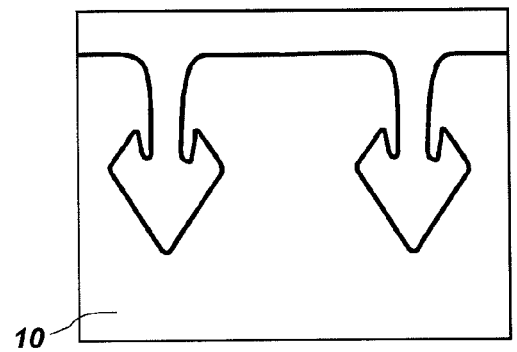
FIG. 2A is a cross-sectional view of single crystal silicon masked along the <110> direction and undercut with dilute TMAH applied at 26° C.
Figure 2B:
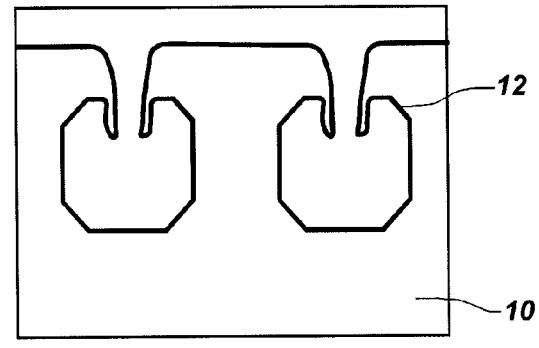
FIG. 2B shows of single crystal silicon masked along the <100> direction and undercut with dilute TMAH applied at 26° C.
Figure 3A:
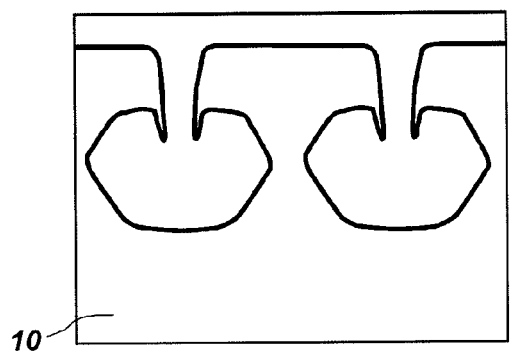
FIG. 3A is a cross-sectional view of single crystal silicon masked along the <110> direction and undercut with a buffered fluoride etch solution of the present invention applied at 23° C.
Figure 3B:
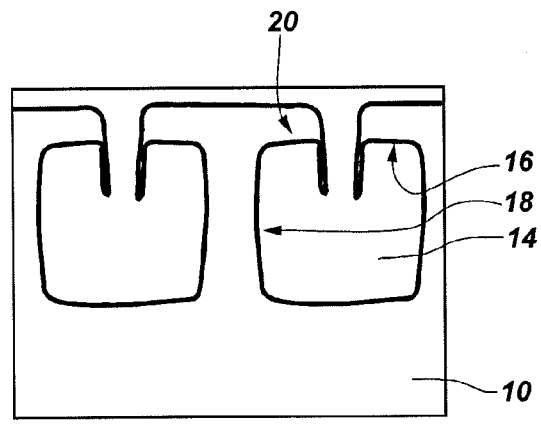
FIG. 3B shows single crystal silicon masked along the <100> direction and undercut with a buffered fluoride etch solution of the present invention applied at 23° C.
Figure 4A:
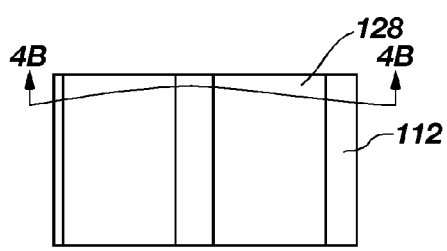
Figure 4B:
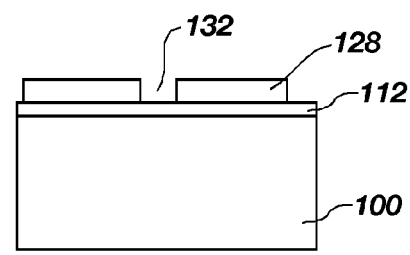
FIG. 4B is a cross-sectional view of the same single crystal silicon wafer taken along line -4B- of FIG. 4A.

As previously described herein, FIGS. 1A-2B show that when NH₄OH or TMAH is used to undercut silicon, virtually no lateral shelf is formed. When performed at a 45° rotation (i.e., patterned along the <100> direction) the corners of the undercut structure have chamfers 12. (FIG. 1B and FIG. 2B). These resulting structures are undesirable for many manufacturing processes. Referring to FIGS. 3A and 3B, a silicon 10 undercut was performed in both the standard silicon orientation (i.e., patterned along the <110> direction) and 45° rotation in (100) silicon using a buffered fluoride etch solution (10 L NH₄F+5 L QEII+7.5 L H₂O₂) at 26° C. according to the present invention. The buffered fluoride etch solution used in FIGS. 3A and 3B demonstrates that the (100) silicon planes is the slow etching planes which allows the creation of square undercuts if the pattern is aligned along the <100> direction. In a typical hydroxide-based etch, the (111) plane is a slow etch; thus, it was surprising to discover a wet etch with a slow plane etch in (100) silicon.

The buffered fluoride etch solution provides very useful selectivity, smooth surfaces and controllable etching of (100) silicon. Referring to FIG. 3B, the lateral shelf 14 and lack of beveled corners enables the easy creation thereon of electrical devices such as FinFETs, Pseudo-SOI or RAD bowls in standard CMOS wafers which are manufactured on (100) silicon. The use of the buffered fluoride etch solution also creates concave square corners without a lateral spacer which is desirable for electronic properties in silicon fingers of sheets which have very different properties from the adjacent material having no material etched. The concave square corners depicted in FIG. 3B are also useful for a discrete change in device mechanical and optical properties when fabricating MEMS. The concave square corners may be formed by a first trench wall 18 substantially perpendicular to a surface of the silicon and a second, undercut trench wall 16 substantially parallel to the surface of the silicon. The concave square corners 20 may define a square undercut feature, such as lateral shelf 14 that includes at least one region (e.g., second, undercut trench wall 16) that extends under a portion of the silicon. The concave square corners 20 in (100) silicon also allow simple integration in CMOS devices and enables MEMS mechanical and optical structures to be integrated with CMOS processing more easily.

The etch rate and selectivity of the buffered fluoride etch solution depends on two competing mechanisms—the oxidation of silicon and the etch rate of oxide. This may be depicted in the following simplified reactions:

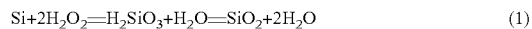

Si+2H₂O₂=H₂SiO₃+H₂O=SiO₂+2H₂O    (1)

Half-cell reduction/oxidation reactions:

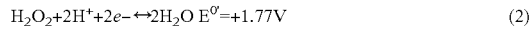

H₂O₂+2H⁺+2e-↔2H₂O E⁰=+1.77V    (2)

Si₅+2OH⁻↔=Si(OH)₂+2e⁻    (3)

H₂SiO₃+6HF↔H₂SiF₆+3H₂O    (4)

The typical selectivity between (100) silicon crystal orientation and thermal oxide is approximately six. The (110) directional etch is approximately two and one half times higher than (100) silicon etch.

Although the buffered fluoride etch solution may be used in various applications, FIGS. 4-11 depict a partial process for creating a pseudo-SOI structure according to a method of the present invention. In each of FIGS. 4A-11D, part A shows a plan view of the structure and part B shows a cross-sectional view of the corresponding structure taken along -B-. FIGS. 4A and 4B depict a single crystal silicon substrate 100. A silicon nitride liner 112 is formed thereover. A masking layer 128, for example, photoresist, is formed over the silicon nitride liner 112 as known in the art. The masking layer 128 may be patterned to form at least one trench mask opening 132. Conventional photolithography or other lithographic or non-lithographic methods, regardless of the presence of the masking layer 128, are also contemplated.

Figure 5A:
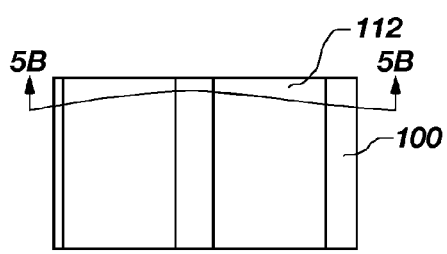
FIG. 5A is a plan view of single crystal silicon wafer according to an embodiment of the present invention.
Figure 5B:
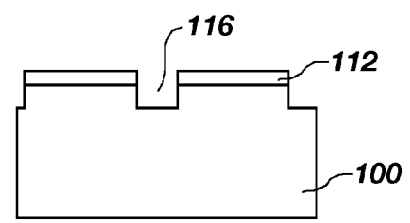
FIG. 5B is a cross-sectional view of the same single crystal silicon wafer taken along line -5B- of FIG. 5A.

Referring to FIGS. 5A and 5B, the silicon nitride liner 112 and single crystal silicon substrate 100 are etched through the mask opening 132 to form at least one trench 116 within the single crystal silicon substrate 100. The etch may be conducted utilizing a dry anisotropic etching chemistry, with or without plasma, for example comprising ammonia and at least one fluorocarbon. Masking layer 128 may remain or may be removed when etching into the single crystal silicon substrate 100. While a specific method of forming trench 116 has been disclosed, it will be understood by one of skill in the art that any method of forming trench 116 may be utilized.

Figure 6A:
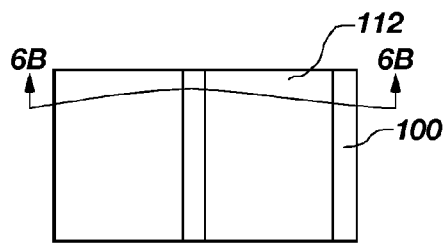
FIG. 6A is a plan view of single crystal silicon wafer according to an embodiment of the present invention.
Figure 6B:
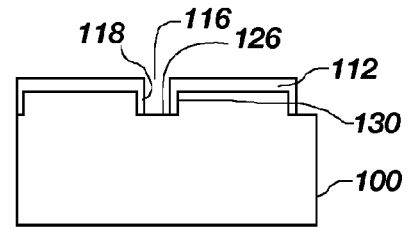
FIG. 6B is a cross-sectional view of the same single crystal silicon wafer taken along line -6B- of FIG. 6A.

Referring to FIGS. 6A and 6B, a nitride layer may be deposited over the silicon nitride liner 112 and trench 116 followed by an etch which removes the nitride from the bottom 126 of the trench 116, but creates nitride spacers 118 on the sidewalls 130 of trench 116. Creation of the Si₃N₄ liner may be performed by conventional techniques.

Figure 7A:
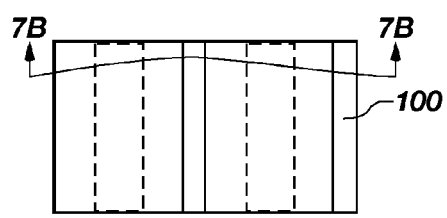
FIG. 7A is a plan view of single crystal silicon wafer according to an embodiment of the present invention.
Figure 7B:
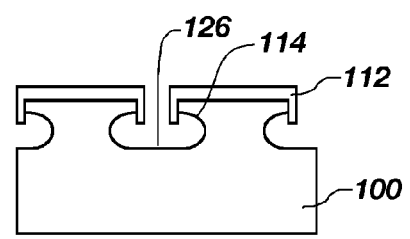
FIG. 7B is a cross-sectional view of the same single crystal silicon wafer taken along line -7B- of FIG. 7A.

The buffered fluoride etch solution of the present invention may then be applied to undercut the single crystal silicon substrate 10. Preferably, the buffered fluoride etch solution may be applied at approximately 23° C. for approximately 5 minutes, depending on the desired size of the lateral shelf 114. As shown in FIGS. 7A and 7B, the buffered fluoride etch solution etches faster in a direction parallel to the single crystal silicon substrate 100 as compared with the vertical etch through the bottom 126 of the trench 116. A lateral shelf 114 having a thickness of approximately 450 Å to 550 Å may be created as shown in FIG. 7B.

Figure 8A:
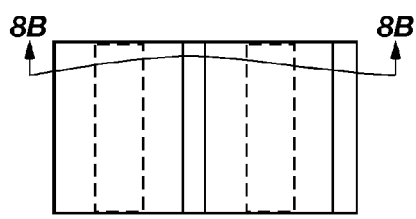
FIG. 8A is a plan view of single crystal silicon wafer according to an embodiment of the present invention.
Figure 8B:
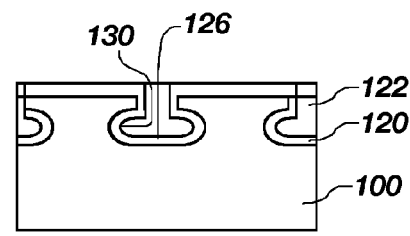
FIG. 8B is a cross-sectional view of the same single crystal silicon wafer taken along line -8B- of FIG. 8A.

If desired, a nitride liner 120 may be deposited on the bottom 126 and sidewalls 130 of the trench 116 and then the trench 116 may be filled with an oxide material 122, for example, a spin-on-dielectric (SOD) as shown in FIGS. 8A and 8B.

A mask 124 is deposited and patterned over the silicon nitride liner 112 and oxide material 122. A conventional silicon etch having some selectivity to oxide may be performed as shown in FIGS. 9A, 9B and 10A-10C.

An optional nitride liner 136 may be deposited and an SOD fill may be performed as shown in FIGS. 11A-11D. After the SOD fill depicted in FIGS. 11A-11D, the structure 150 may be subjected to further processing to form, for example, transistors, capacitors and digit lines thereover to complete the pseudo-SOI structure. The structure 150 includes a lateral shelf 114 having a thickness of about 500 Å (+/−10%).

The resulting structure, including any transistors, such as array transistors or access transistors, overlying structure 150, has significantly lower leakage due to the presence of oxide material 122 underlying the silicon. (See, e.g., FIG. 11B). It will be understood that structure 150 is not limited to being an intermediate pseudo-SOI structure. Any number of additional fabrication steps may be performed in conjunction with the present invention to create any desired device.

Figure 12A:
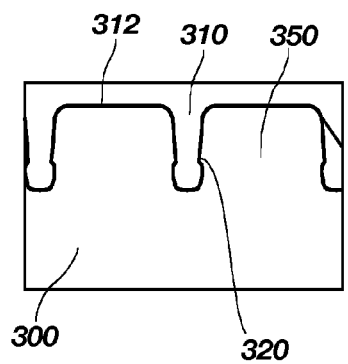
FIGS. 12A-12E show a progressive undercut etch of single crystal silicon using a buffered fluoride etch solution of the present invention. The trenches are in the <100> direction on (100) silicon.
Figure 12B:
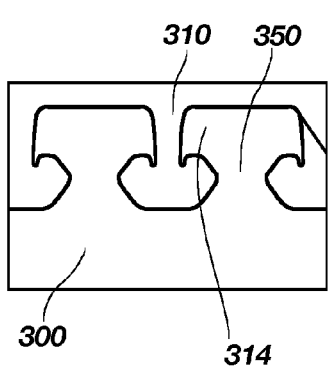
Figure 12C:
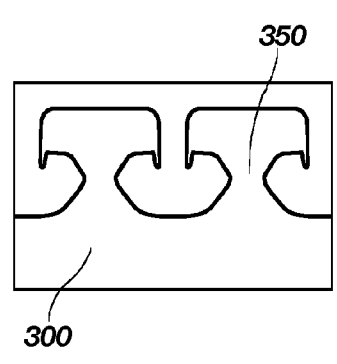
Figure 12D:
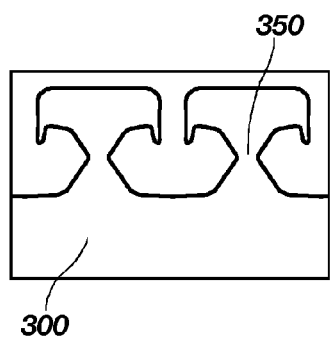
Figure 12E:
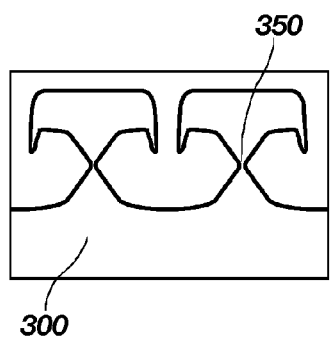
Figure 13A:
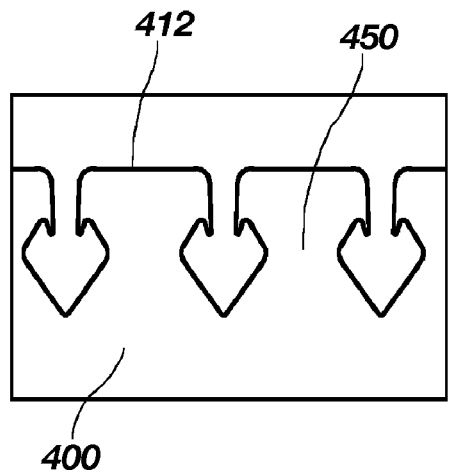
FIGS. 13A-13D show a progressive undercut etch of single crystal silicon using a buffered fluoride etch solution of the present invention after exposure to $NH_4OH$. The trenches are in the <100> direction on (100) silicon.
Figure 13B:
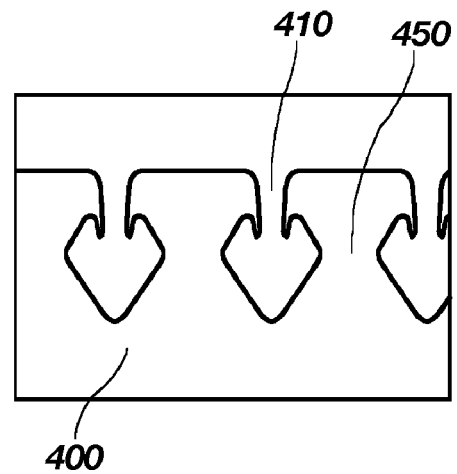
Figure 13C:
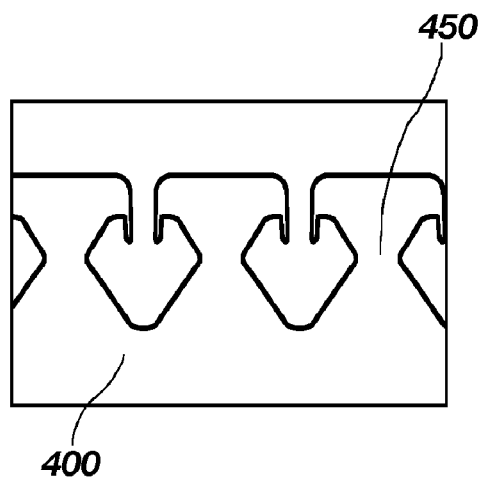
Figure 13D:
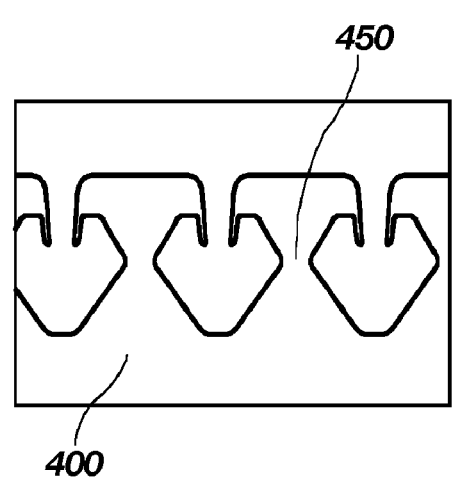

FIGS. 12A-12E depict silicon oxidation and etching using a solution of $NH_4F$, QEII and $H_2O_2$ (provided in a ratio of 4:2:3). The substrate was immersed in a stagnant bath of the $NH_4F$, QEII and $H_2O_2$ solution at 23° C. FIG. 12A depicts a trench 310 in single crystal silicon 300 with a nitride liner 320 prior to addition of the buffered fluoride etch solution of the present invention. A top surface 312 of the single crystal silicon represents the (100) plane. The trench 310 is <100> on the (100) plane. After 16 minutes of exposure to the buffered fluoride etch solution at approximately 23° C., an undercut profile is visible having a lateral shelf 314. (FIG. 12B) The etch is progressing faster perpendicular to the (100) direction (i.e., perpendicular to the STI sidewall), than in the (100) direction (i.e., perpendicular to the wafer surface) as shown in FIGS. 12C, 12D and 12E after 22 min, 25 min and 28 min exposure, respectively. As seen in FIGS. 12A-12E, the width of the underlying silicon leg, or pillar, 350, decreases with increased exposure to the buffered fluoride etch solution.

The buffered fluoride etch solution may be combined with other components in combination with pattern angles to manufacture vertical walls in various ways. FIG. 13A-13D depicts the etch progression of single crystal silicon 400 at 0 min (FIG. 13A), 3 min (FIG. 13B), 6 min (FIG. 13C) and 9 min (FIG. 13D) exposure to the $NH_4F$, QEII and $H_2O_2$ solution (the buffered fluoride etch solution) after a five minute anisotropic $NH_4OH$ etch at 23° C. Exposure occurred using a stagnant bath. A top surface 412 of the single crystal silicon represents the (100) plane. A trench 410 is <100> on the (100) plane. Increasing the time of the buffered fluoride etch solution etch forms a shelf undercut of the silicon active area without significantly increasing the trench depth. Further, it can be seen that the silicon legs, or pillars, 450 under the single crystal silicon 400 becomes increasingly narrow as the etch progresses. Thus, it will be understood that using appropriate pattern angles in combination with etchant solutions of the present invention, devices may be manufactured having various characteristics. By manipulating the etch time and etchant combination, different undercut profiles may be achieved. For example, the buffered fluoride etch solution may be combined with hydroxides, $NH_4OH$, $NH_4F$, TMAH or combinations thereof.

The invention may further be understood by the following non-limiting examples.

Example 1

Figure 14A:
FIGS. 14A and 14B show transmission electron micrographs (TEMs) of an integrated PSOI DRAM access structure.
Figure 14B:
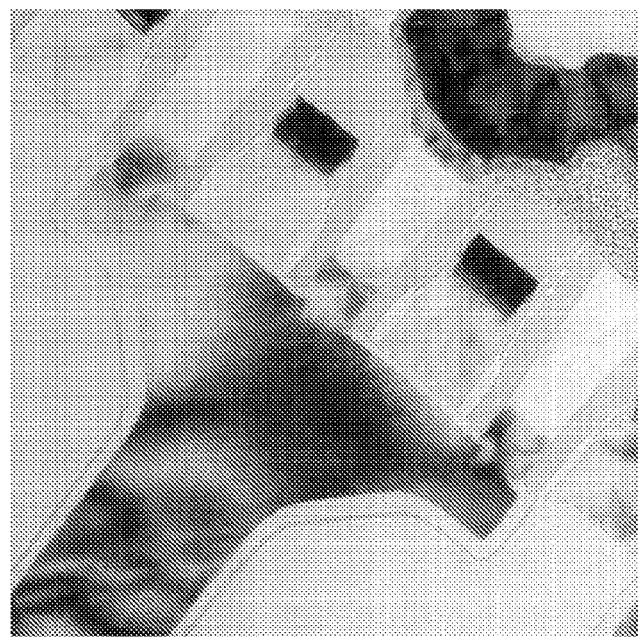

FIGS. 14A and 14B depict two TEMs of an integrated PSOI DRAM access structure. The profile was created by the combination of a TMAH (100:1) etch of 4 minutes 36 seconds at 25° C. A second etch using the buffered fluoride etch solution ($NH_4F$, QEII and $H_2O_2$ provided in a ratio of 4:2:3) was run at 25° C. for 6 minutes. A conventional oxide spacer was used for the two wet etches and removed after the cavity creation. The image is shown in the <100> direction after the access transistors and bit line were integrated along with poly-silicon plugs between the transistor gates.

All documents cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the etch compositions described herein. Various modifications of the illustrative embodiments, as well as additional embodiments of the invention, will be apparent to persons skilled in the art upon reference to this description. While the preferred embodiments of the present invention have been described herein, the invention defined by the claims herein is not limited by particular details set forth in the above description, as many apparent variations thereof are possible without departing from the spirit or scope thereof.

What is claimed is:

1. An intermediate semiconductor device comprising:
    at least one trench formed in a surface of a single crystal silicon substrate and including a first trench wall substantially perpendicular to the surface of the single crystal silicon substrate and a second, undercut trench wall substantially parallel to the surface of the single crystal silicon substrate; and
    at least one structure directly on and in contact with at least a portion of the surface of the single crystal silicon substrate and extending past the second, undercut trench wall substantially parallel to the surface of the single crystal silicon substrate.

2. The intermediate semiconductor device of claim 1, wherein the at least one trench comprises a substantially diamond-shaped region when aligned along a <110> direction and a substantially square-shaped region when aligned along a <100> direction.

3. The intermediate structure of claim 1, wherein the second, undercut trench wall extends under a portion of the single crystal silicon of the substrate.

4. The intermediate semiconductor device of claim 1, wherein the surface of the single crystal silicon substrate comprises (100) silicon.

5. The intermediate semiconductor device of claim 1, wherein the at least one trench formed in the surface of the single crystal silicon substrate comprises at least one square undercut region without beveled edges.

6. A semiconductor device comprising:
    at least one trench formed in a surface of single crystal silicon and including a square undercut feature having at least one region extending under a portion of the single crystal silicon; and
    at least one structure overlying and directly contacting at least one surface of the single crystal silicon substrate and sidewalls of the at least one trench and at least partially extending into the square undercut feature.

7. The semiconductor device of claim 6, wherein the at least one structure comprises a nitride material.

8. The semiconductor device of claim 6, wherein the square undercut feature is defined by square corners and lacks beveled corners.

9. The semiconductor device of claim 6, wherein the surface of the single crystal silicon comprises (100) silicon.

10. The semiconductor device of claim 6, wherein the square undercut feature having the at least one region extending under the portion of the single crystal silicon comprises a cavity defined by concave square corners within the single crystal silicon.

11. A semiconductor device structure comprising:
- at least one opening extending into a single crystal silicon substrate and including an undercut region defined by concave square corners within the single crystal silicon substrate; and
- a nitride material directly on and in contact with at least a portion of a surface of the single crystal silicon substrate and at least partially extending into the undercut region.

12. The semiconductor device structure of claim 11, wherein the surface of the single crystal silicon substrate comprises (100) silicon.

13. The semiconductor device structure of claim 11, wherein the undercut region comprises a first trench wall substantially perpendicular to a surface of the single crystal silicon substrate and a second trench wall substantially parallel to the surface of the single crystal silicon substrate.

14. The semiconductor device structure of claim 11, wherein the undercut region comprises is defined by at least one surface extending under a portion of the single crystal silicon substrate.

* * * * *